(12) United States Patent
Wu

(10) Patent No.: US 6,799,029 B2
(45) Date of Patent: Sep. 28, 2004

(54) MIXER OF COMMUNICATION SYSTEM

(75) Inventor: Tzung-Hsiung Wu, Taipei (TW)

(73) Assignee: Macronix International Co. Ltd., Hsinchu (TW)

( * ) Notice: Subject to any disclaimer, the term of this patent is extended or adjusted under 35 U.S.C. 154(b) by 686 days.

(21) Appl. No.: 09/804,868

(22) Filed: Mar. 13, 2001

(65) Prior Publication Data

US 2002/0055348 A1 May 9, 2002

(30) Foreign Application Priority Data

Oct. 6, 2000 (TW) .......................... 89120915 A

(51) Int. Cl.⁷ ................................................ H04B 1/26
(52) U.S. Cl. ...................... 455/323; 455/313; 455/326; 455/333; 327/113; 327/359
(58) Field of Search ................................ 455/323, 313, 455/130, 314, 315, 316, 317, 318, 319, 339, 341, 344, 346, 131, 139; 327/113, 358, 355, 356, 116, 105, 362, 233, 359; 330/228, 254

(56) References Cited

U.S. PATENT DOCUMENTS

| | | | | |
|---|---|---|---|---|
| 4,385,401 A | * | 5/1983 | Jagnow et al. ............... 455/326 |
| 5,886,547 A | * | 3/1999 | Durec et al. ................. 327/113 |
| 5,898,912 A | * | 4/1999 | Heck et al. ............... 455/234.2 |
| 5,999,804 A | * | 12/1999 | Forgues ...................... 455/333 |
| 6,057,714 A | * | 5/2000 | Andrys et al. ............... 327/105 |
| 6,073,002 A | * | 6/2000 | Peterson ..................... 455/326 |
| 6,111,452 A | * | 8/2000 | Fazi et al. ................... 327/355 |
| 6,400,936 B1 | * | 6/2002 | Trask .......................... 455/326 |
| 6,512,408 B2 | * | 1/2003 | Lee et al. .................... 327/359 |
| 6,650,883 B1 | * | 11/2003 | Stephane et al. ........... 455/313 |

* cited by examiner

Primary Examiner—Pablo N. Tran
(74) Attorney, Agent, or Firm—J. C. Patents

(57) ABSTRACT

A mixer of a communication system. The communication system has an antenna, low noise amplifier, a mixer, a local oscillator and an intermediate frequency filter. The mixer has a mixer circuit, a gain amplified circuit, a voltage auto-tracking circuit and a direct current voltage generating circuit. The direct current voltage generating circuit can reduce the output power of the local oscillator, extend the lifetime of the battery used in the mobile communication system, and reduce the distortion of harmonic wave of the local oscillator to reduce the noise figure of the mixer. Using the voltage auto tracking circuit and the gain amplified circuit, the linearity of the mixer is enhanced, and the conversion gain of the mixer is adjusted by varying the load resistors.

4 Claims, 10 Drawing Sheets

MIXER OF COMMUNICATION SYSTEM

CROSS-REFERENCE TO RELATED APPLICATION

This application claims the priority benefit of Taiwan application serial no. 89120915, filed Oct. 6, 2000.

BACKGROUND OF THE INVENTION

1. Field of the Invention

The invention relates in general to a mixer of a communication system. More particularly, this invention relates to a mixer with the functions of increasing conversion gain, reducing noise figure and enhancing linearity.

2. Description of the Related Art

FIG. 1 is a block diagram showing a receiving part of a conventional communication system. A radio frequency signal is received by an antenna 10 and sent to a low noise amplifier 12. Being amplified by the low noise amplifier 12, a radio frequency $P_i$ is output to a mixer 14. If the radio frequency signal $P_i$ has a frequency of 1800 kHz, a high frequency signal of 1810 kHz is fed into the mixer 14 from a local oscillator 16.

After receiving the radio frequency $P_i$ and the high frequency signal, the mixer 14 outputs an output signal $P_0$ to an intermediate frequency filter 18. The high frequency signal is filtered by the intermediate frequency filter 18, and an intermediate frequency signal is output to a sub-ordinary circuit (not shown). The frequency of the intermediate frequency signal is about 10 kHz.

FIG. 2 shows a circuit diagram of a Gilbert multiplier. In FIG. 2, a Gilbert multiplier 20 is used as a mixer. Three differential amplifiers are assembled by an NMOS M1 22 and an NMOS M2 24, an NMOS M3 26 and an NMOS M4 28, and an NMOS M7 30 and an NMOS 32, respectively. The NMOS M7 34 is used as a current source.

In FIG. 2, the Gilbert multiplier used as a mixer circuit 20 has an output power signal $P_0$ as:

$P_0 = P_{LO} \times P_i$ $P_{LO} = A_2 \sin \omega_{LO} t$ $P_i = A_1 \sin \omega_i t$ $$P_0 = A_1 A_2 \sin\omega_i t \cdot \sin\omega_{LO} t$$
$$= 1/2 \ A_1 A_2 [\cos(\omega_{LO} - \omega_i)t - \cos(\omega_{LO} - \omega_i)t]$$

wherein, $P_i$ is the input power signal input from an RF input terminal to the mixer circuit 20, and $P_{LO}$ is the input power signal input from the LO input terminal to the mixer circuit 20. $A_1$ is the amplitude of the input power signal $P_i$, and $A_2$ is the amplitude of the input power signal $P_{LO}$. $\omega_i$ is the frequency of the input power signal $P_i$, and $\omega_{LO}$ is the frequency of the input power signal $P_{LO}$. $\omega_i + \omega_{LO}$ is a high frequency signal, and $\omega_i - \omega_{LO}$ an intermediate frequency signal. Through the intermediate frequency filter, the intermediate frequency signal $\omega_i - \omega_{LO}$ can be obtained from the high frequency signal $\omega_i + \omega_{LO}$.

The characteristics of the mixer can be described by the following parameters:

(1) The conversion gain C. G.=$P_0/P_i$;
(2) The noise figure NF=$(S_0/N_0)/(S_i/N_i)$; and
(3) The linearity as shown as the curve of the mixer in FIG. 3. When an actual curve is different from the ideal curve with 1 dB, the relationship between the input power and output power is judged to determine the degree of the linearity of the mixer.

In a mobile communication system, a large conversion gain and a small noise figure of the mixer can be obtain by increase the output power of the local oscillator input to the mixer. However, to increase the output power of the local oscillator increase the power consumption of the mobile communication system to reduce the lifetime of the battery of the mobile communication system. If the output power of the local oscillator is decreased, the linearity of the mixer is decreased.

SUMMARY OF THE INVENTION

The invention provides a mixer of a communication system to reduce the output power of the local oscillator, extend the lifetime or operation time of the battery, suppress the distortion of harmonic wave of the local oscillator, and to reduce the noise figure and enhance the linearity of the mixer.

A mixer of a communication system comprising an antenna, a low noise amplifier, a mixer, a local oscillator and an intermediate frequency filter is provided in the invention. The mixer comprises a mixer circuit to perform a multiplication on a radio frequency received from the antenna and a radio frequency generated from the local oscillator. A gain amplified circuit is coupled a power supply terminal of the mixer circuit to increase the linearity of the mixer circuit. An voltage auto-tracking circuit is coupled to an output terminal of the gain amplified circuit to control the direct voltage output from output terminal of the gain amplified circuit. A direct current voltage generating circuit is coupled to the input terminal of the local oscillator of the mixer circuit to generate a fix threshold voltage.

The voltage auto-tracking circuit further comprises a resistor, a capacitor, an operation amplifier and an NMOS. The resistor has one terminal coupled to the output terminal of the gain amplified circuit. One terminal of the capacitor is coupled to ground, while the other terminal of the capacitor is coupled to the other terminal of the resistor. The positive terminal of the operation amplifier is coupled to the other terminal of resistor, and the negative terminal of the operation amplifier is coupled to a reference voltage. The NMOS has a drain coupled to a power source, a source coupled to output terminal of the gain amplified circuit, and a gate coupled to an output terminal of the operation amplifier. A base of the NMOS is coupled to the source of the NMOS. The NMOS is used to provide a direct current.

The gain amplified circuit comprises a first current mirror circuit, a second current mirror circuit and a third current mirror circuit. The first mirror circuit has an impedance with one terminal coupled to a power source and the other end coupled to a first power input terminal of the mixer circuit. The first mirror circuit comprises a direct source coupled to the power source. The first current mirror circuit provides a direct current to the mixer circuit. The second current mirror circuit comprises an impedance with one terminal coupled to the power source and the other terminal coupled to a second power input terminal of the mixer circuit. The second current mirror circuit provides a direct current to the mixer circuit. The third mirror circuit comprises an impedance with one terminal coupled to a current source of the first current mirror circuit and the other terminal coupled to ground. The third current mirror circuit comprises a current source with one terminal coupled to an output terminal of the gain amplified circuit, and the other end coupled to ground. The third current mirror circuit also provides a direct current.

In the direct current voltage generating circuit, a first PMOS has a source coupled to the power source, and a base coupled to its drain. A first NMOS has a drain coupled to the drain of the first PMOS, a gate coupled to its own drain, and a base of the first NMOS coupled to its own source. A second NMOS has a drain coupled to the source of the first NMOS, a gate coupled to its own drain, and a base coupled its own source. A second PMOS has a source coupled to the power source, a gate coupled to the gate of the first PMOS, a drain coupled to its own gate, and a base coupled to its drain. A third NMOS has a drain coupled to the drain of the second PMOS, a gate coupled to the gate of the first NMOS, and a base coupled to its source. A fourth NMOS has a drain coupled to the source of the third NMOS, a gate coupled to the gate of the second PMOS, a source coupled to the source of the second NMOS, and a base coupled to its own source. A fifth NMOS has a gate coupled to a bias power source, a source coupled to ground, and a base coupled to its own source. A third PMOS has a source coupled to the power source, a gate coupled to the drain of the second PMOS, a drain coupled to the output terminal of the direct current voltage generating circuit, and a base coupled to its own drain. A sixth NMOS has a drain coupled to the drain of the third PMOS, a gate coupled to its own drain, a source coupled to the source of the third NMOS, and a base coupled to its own source.

Therefore, the invention provides a mixer of a communication system using direct current voltage generating circuit. The output power of the local oscillator is reduced, the lifetime of the battery used in the communication system is extended, and the harmonic wave distortion of the local oscillator is reduced to reduce the noise figure of the mixer. Using the voltage auto-tracking circuit and the gain amplified circuit, the linearity of the mixer is enhanced, and the conversion gain of the mixer can be adjusted by varying the load resistor.

Both the foregoing general description and the following detailed description are exemplary and explanatory only and are not restrictive of the invention, as claimed.

DESCRIPTION OF THE PREFERRED EMBODIMENTS

Figure 1:
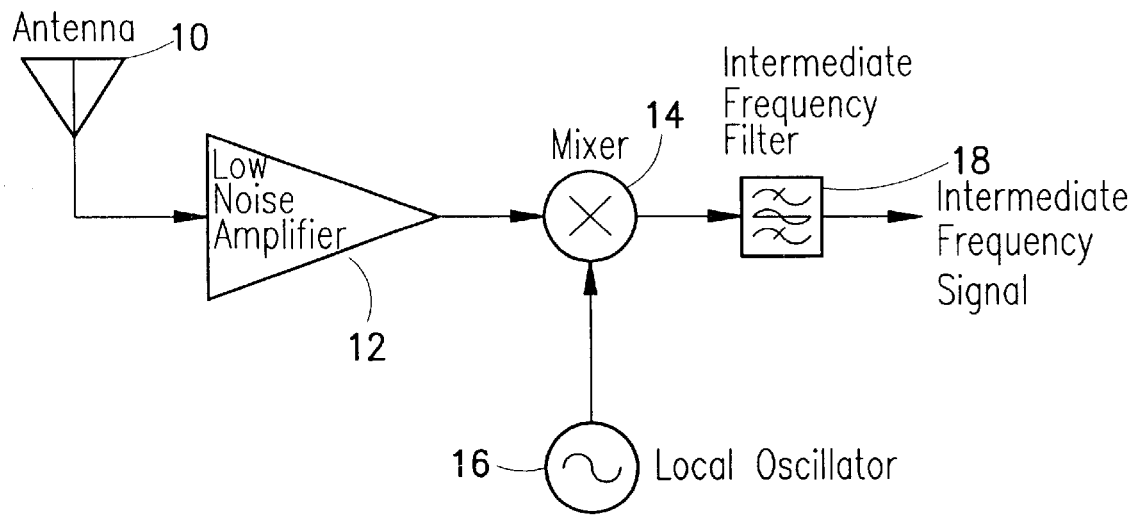
FIG. 1 is a block diagram of a conventional communication system.
Figure 2:
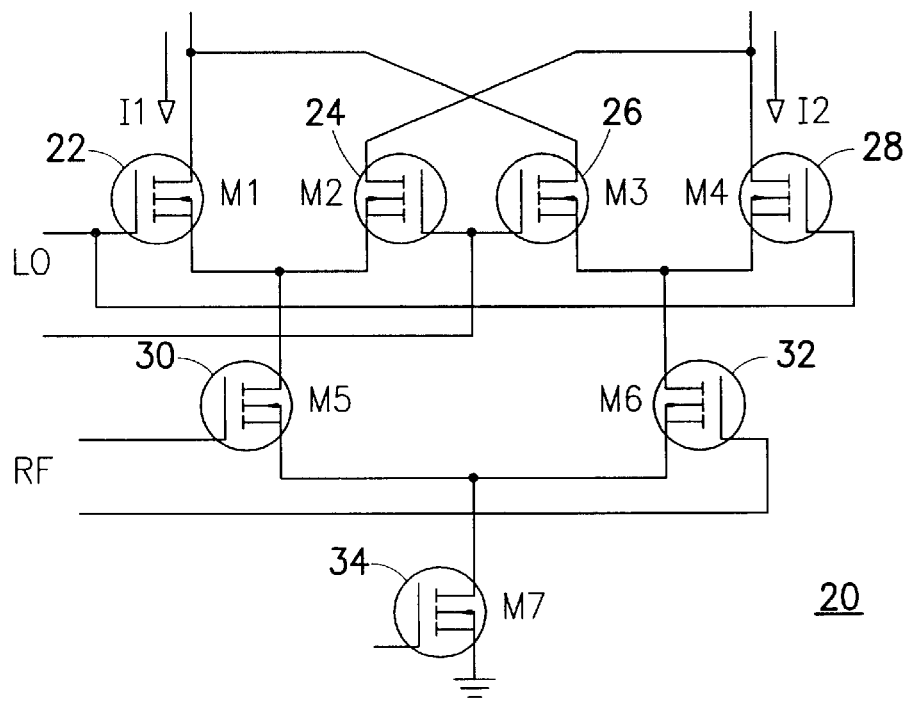
FIG. 2 is circuit diagram of a Gilbert multiplier.
Figure 3:
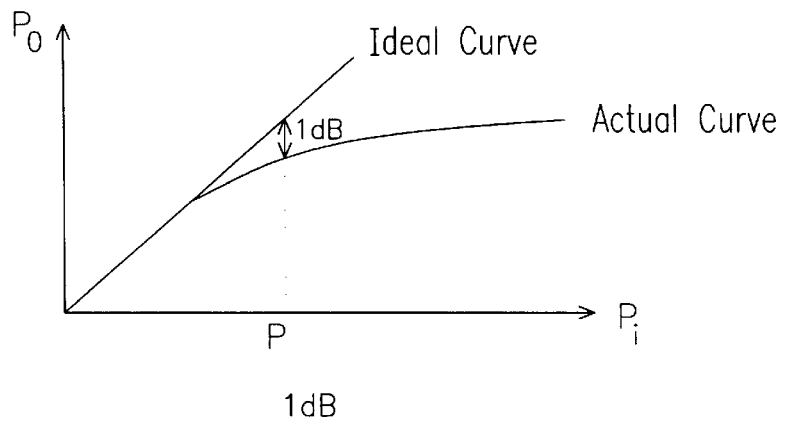
FIG. 3 is a graph showing a linearity of a mixer.
Figure 4:
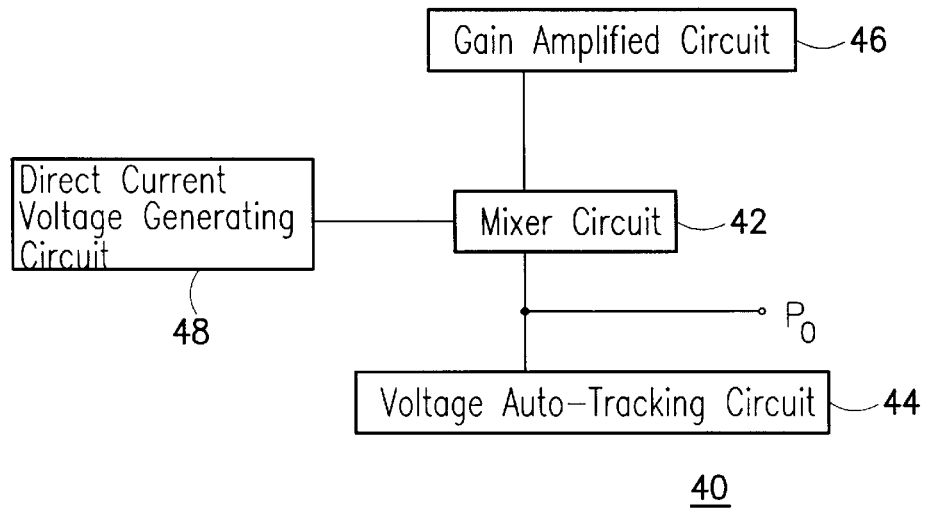
FIG. 4 is a block diagram showing the mixer provided in the invention.

FIG. 4 shows a block diagram of a mixer 40. The mixer 40 comprises a mixer circuit 42, a voltage auto-tracking circuit 44, a gain amplified circuit 46 and a direct current voltage generating circuit 48. The Gilbert multiplier as shown in FIG. 2 can be adapted as the mixer circuit 42. The mixer circuit 42 performs a multiplication on a received radio frequency signal and a radio frequency generated from a local oscillator (referring to FIG. 1) to obtain a high frequency signal and an intermediate frequency signal. (The high frequency is filtered out in the intermediate frequency filter in the sub-ordinary circuit.).

The voltage auto-tracking circuit 44 is coupled to an output terminal $P_o$ of the mixer circuit 42 to control the output direct current voltage from the mixer circuit 42, so as to obtain a maximum amplitude of the output signal of the mixer circuit 42. The gain amplified circuit 48 is coupled to a power supply terminal of the mixer circuit 42. The gain amplified circuit 48 increases the output gain of the mixer circuit 42 and enhance the linearity of the mixer circuit 42. The direct current voltage generating circuit 46 is coupled to an input terminal of the local oscillator of the mixer circuit 42 to generate a fixed threshold voltage. The power consumption of the local oscillator (referring to FIG. 1) can thus be reduced, and improved conversion gain and noise figure can be obtained in the mixer 40.

Figure 5:
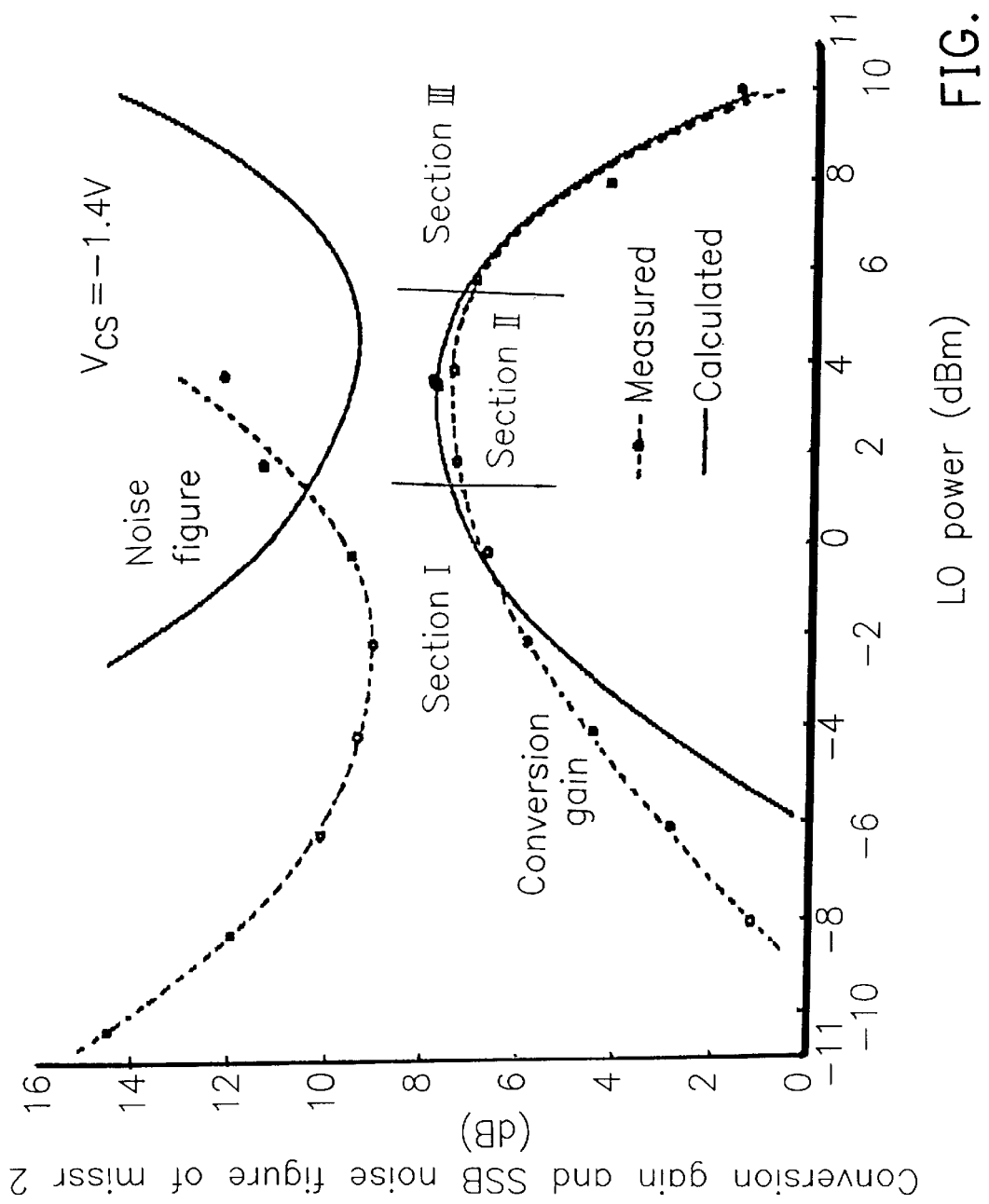
FIG. 5 shows a relationship between a conversion gain and the noise figure, and s power output of a local oscillator.

FIG. 5 shows a curve of a relationship between the conversion gain and noise figure and the power of the local oscillator. The conversion gain and figure noise while using the Gilbert multiplier as the mixer is shown as FIG. 5. In the section I of FIG. 5, the signal output is proportion to the power of the local oscillator when the power is small. The mixer is like an ideal multiplier in this second. In section II, all the transistors used as switches (the NMOS M1 to M4 as shown in FIG. 2) are conducted. In this section, the minimum noise figure and the largest conversion gain of the mixer can be obtained. In section III, too much power of the local oscillator causes the decrease of the conversion gain.

In a mobile communication system, to reduce the power of the local oscillator can increase the output power of the oscillator, so as to extend the lifetime of the battery used in the mobile communication system, reduce the harmonic wave distortion. Furthermore, the noise figure of the mixer can be increased to increase the isolation between local oscillator-radio frequency (LO-RF) and the local oscillator-Intermediate frequency (LO-IF).

Figure 6:
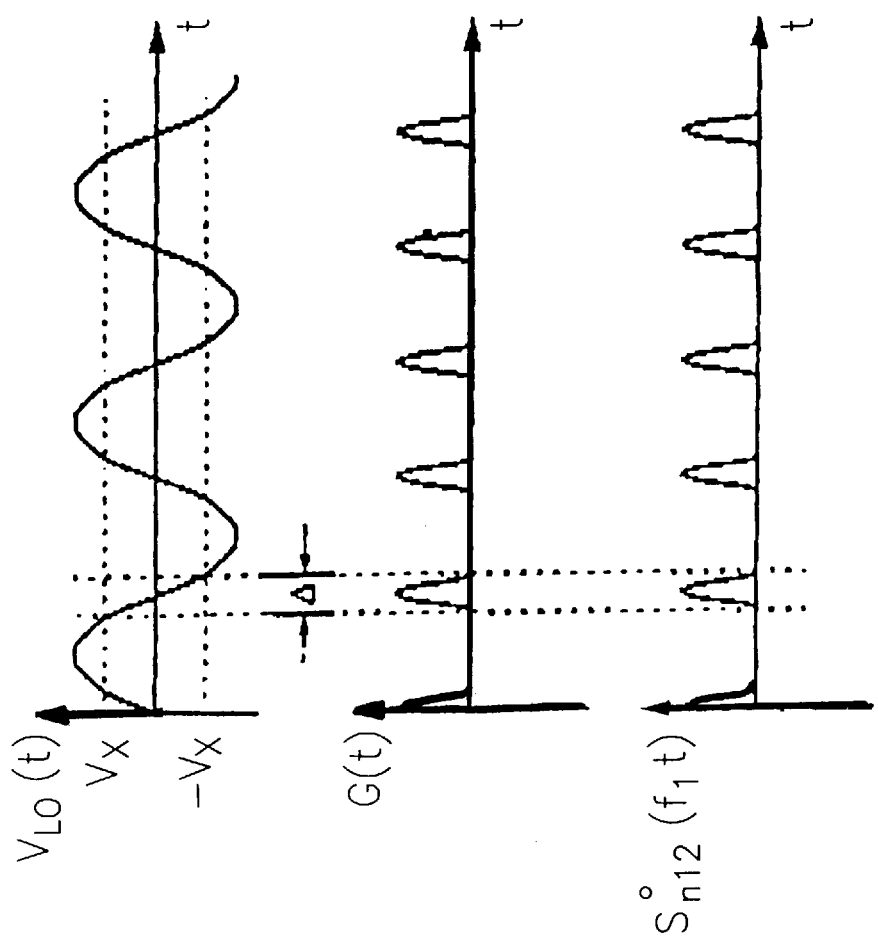
FIG. 6 shows a relationship between the transistor and the power spectra density the generated noise.

FIG. 6 shows a relationship between the transistor and the power spectra density (PSD) generated noise of the generated noise. In FIG. 6, when the voltage $V_{LO}$ is higher than $\pm V_x$, the switch transistor is conducted and enters a triode region. Meanwhile, the current can flow through the switch transistor, and the power spectra density of the channel resist noise of the switch transistor entering the output terminal of the mixer can be expressed as:

$$S_{n/2}^0 = 16KT\gamma\left(\frac{gm1 \cdot gm2}{gm1 + gm2}\right)$$

wherein gm is the conductance, K is the Boltzman constant, T is the absolute temperature, and $\gamma=\frac{2}{3}$ for a long channel transistor.

In FIG. 6, when $V_{LO}$ is higher than $\pm V_x$, the noise does not enter the output terminal of the mixer. To improve the performance of the mixer, the duration $\Delta$ for the magnitude of $V_{LO}$ between $\pm V_x$ has to be decreased. To increase the power of the local oscillator or reduce the bias current can also achieve the objective. However, to increase the power of the local oscillator is disadvantageous to the mobile communication system, and to increase the bias current results in a worse linearity and a decreased gain. Another method is to reduce the drain voltage of a switch transistor and to have the bias fall at the edge between the saturation region and the triode, the switch transistor can thus easily reaches the triode region.

Figure 7:
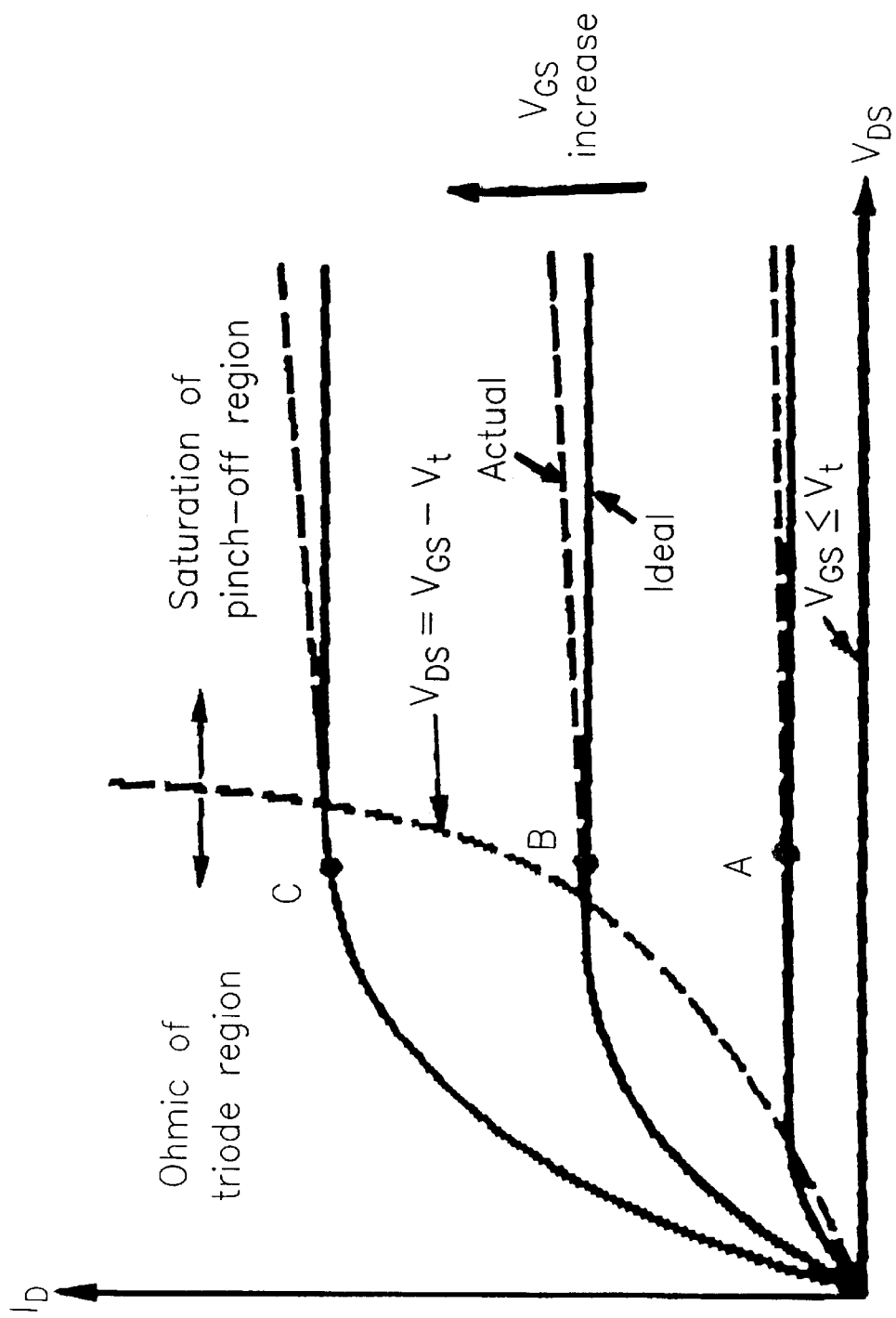
FIG. 7 shows the characteristics of the NMOS.
Figure 8:
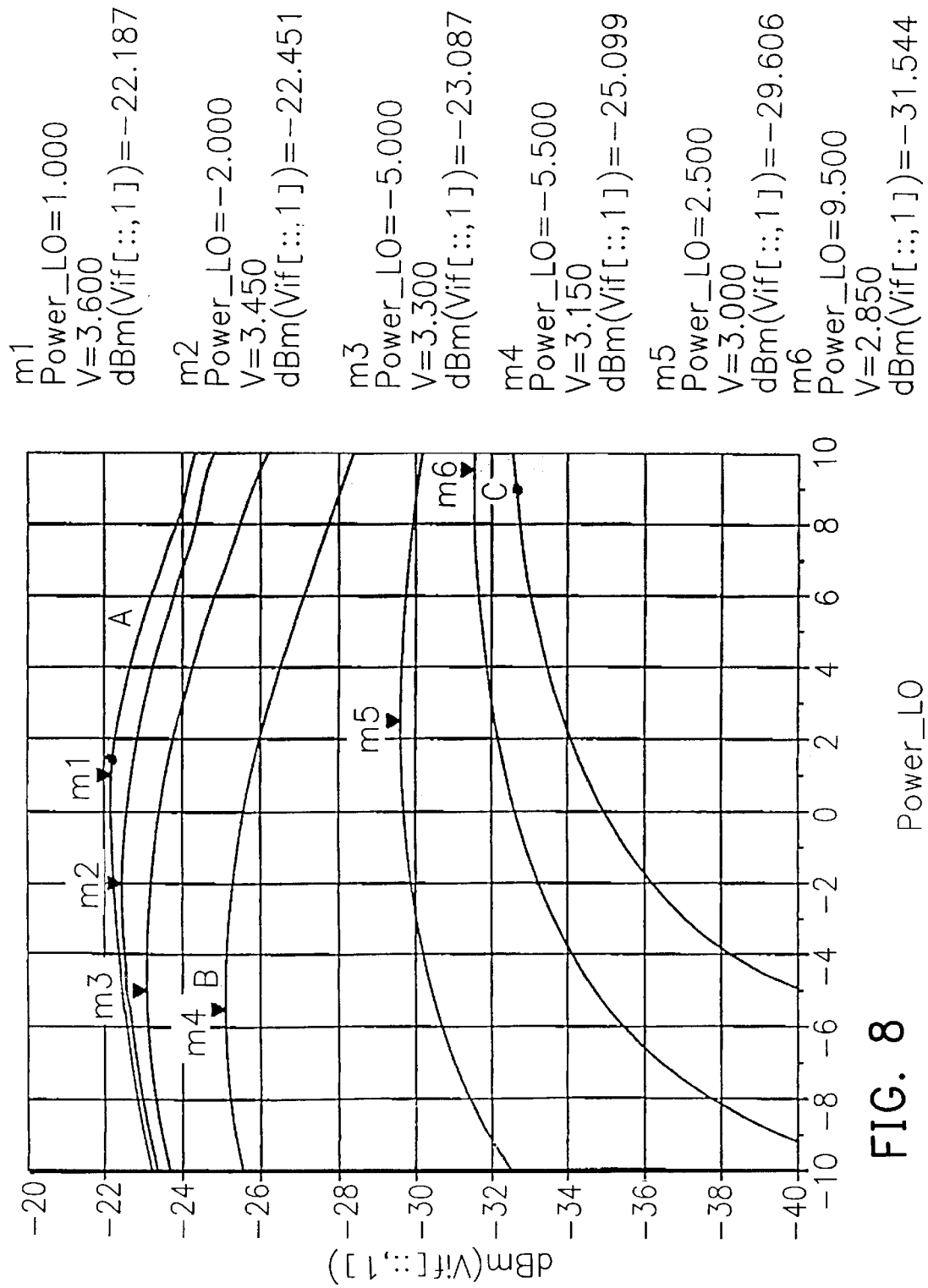
FIG. 8 shows a relationship between the local output power and the conversion gain.

FIG. 7 shows the characteristics of the NMOS device. In FIG. 7, three operation points A, B and C are selected. Point A is in the saturation region, point B falls at the edge between the saturation region and the triode region, and point B is in the triode region. In FIG. 8, the curve A represents the relationship when the switch transistor operates at a bias at the point A in FIG. 7. The curve B represents the relationship when the switch transistor operates at a bias at the point B in FIG. 7. The curve C represents the relationship when the switch transistor operates at a bias at the point C in FIG. 7. Apparently, the bias operation at point A requires a large local oscillator power, the bias operation at point C does not only require a large local oscillator power, but also reduce the conversion gain. It is because that when the switch transistor requires a high voltage to leave the triode region. In addition, the leakage of the switch transistor also causes the conversion gain decrease. To have the smallest local oscillator power, the bias of the switch transistor has to be set at the edge between the saturation region and the triode region, that is, at point B.

The power of the battery decays as the mobile communication system being used, therefore, the voltage of the battery gradually decreases to cause a difference in voltage at the drain of the switch transistor. Thus, the bias operation point of switch transistor varies to affect the conversion gain and noise figure of the mixer. A direct current voltage generating circuit is thus designed to enable the bias operating point of the transistor varies as the voltage of the battery changes.

Figure 9:
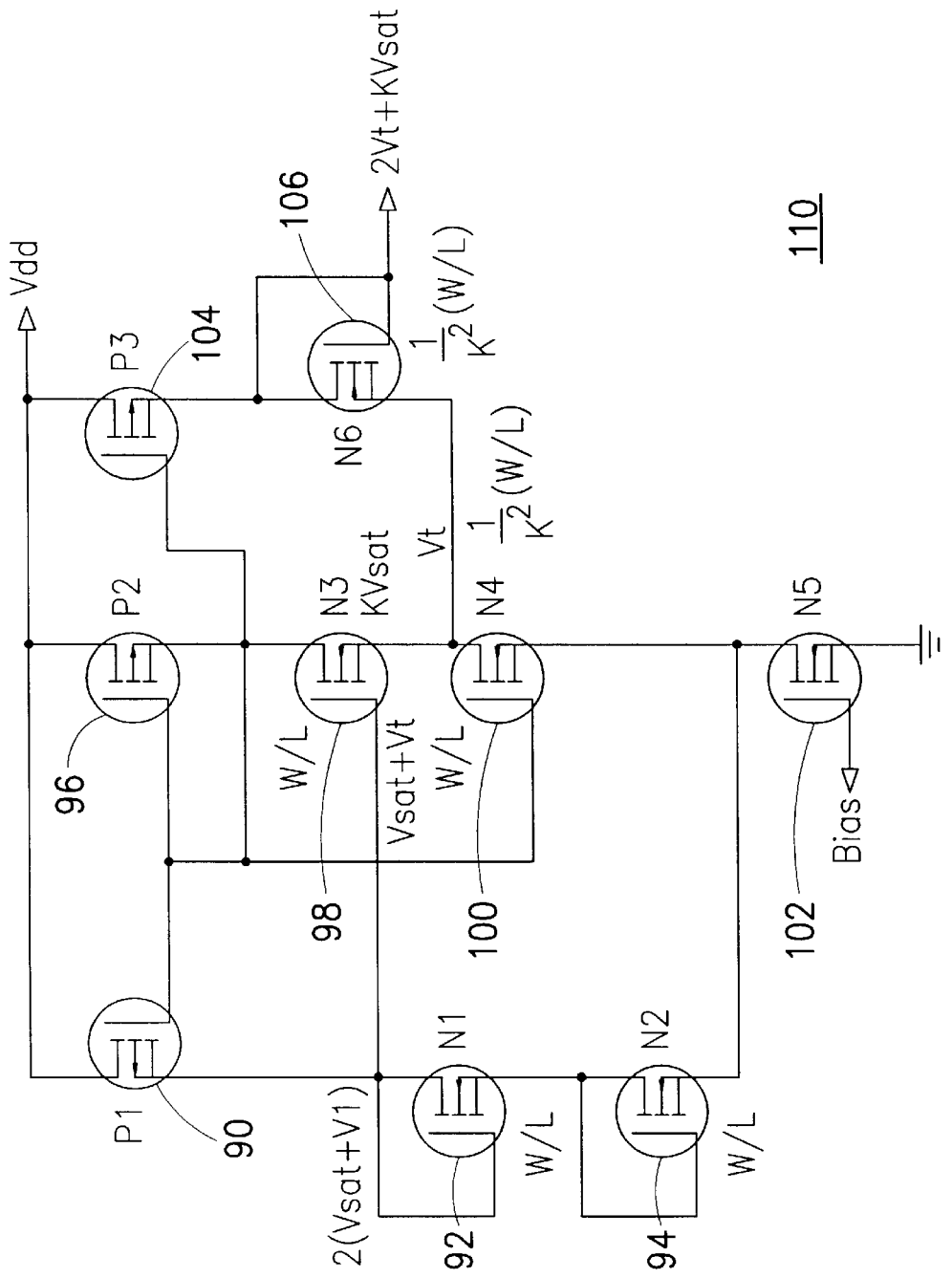
FIG. 9 shows an equivalent circuit of a direct current voltage generating circuit provided in the invention.

FIG. 9 shows a circuit diagram of the direct current voltage generating circuit 110. In FIG. 9, a PMOS P1 90 has a source coupled to a power source Vdd, and a base coupled to its own drain. An NMOS N1 92 has a drain coupled to the drain of the PMOS P1 90, a gate coupled to its own drain, a base coupled to its own source. An NMOS N2 94 has a drain coupled to the source of the NMOS N1 92, a gate coupled to its own drain, a base coupled to its own source.

A PMOS P2 96 has a source coupled to the power source Vdd, a gate coupled to the gate of the PMOS P1 90, a drain coupled to its own gate, and a base coupled to its own drain. An NMOS N3 98 as drain coupled to the drain of the PMOS P2 96, a gate coupled to the gate of the PMOS P2 96, a and base coupled to its own source. An NMOS N4 100 has a drain coupled to the source of the NMOS N3 98, a gate coupled to the gate of the PMOS P2 96, a source coupled to the source of the NMOS N2 94, and a base coupled to its own source. An NMOS N5 102 has a drain coupled to the source of the NMOS N4 100, a gate coupled to a bias power source Bias, a source coupled to ground, and a base coupled to its own source.

A PMOS P3 104 has a source coupled to the power source Vdd, a gate coupled to the drain of the PMOS P2 96, a drain coupled to an output terminal of the direct current voltage generating circuit 110, and a base coupled to its own drain. An NMOS N6 104 has a drain coupled to the drain of the PMOS P3 104, a gate coupled to its own drain, a source coupled to the source of the NMOS N3 98, and a base coupled to its own source.

In FIG. 9, the power source Vdd providing the power to the direct current voltage generating circuit 110 is the same as the power source providing the power to the mixer circuit (referring to FIG. 2). When the power source Vdd is dropped, the drain voltage of the switch transistor of the mixer circuit is consequently dropped (referring to FIG. 2). The output voltage from the direct current voltage generating circuit 110 to the input terminal of the local oscillator is varied with the drain voltage of the switch transistor to ensure that the switch transistor is operated at the edge between the saturation region and the triode region.

In semiconductor fabrication process, the threshold voltage $V_t$ of every transistor is not identical. The drain region is affected by the threshold voltage $V_t$ of the switch transistor. The direct current generating circuit 110 can also enable the switch transistor to be operated at an edge between the saturation region and the triode region to obtain the optimum conversion gain and noise figure.

Figure 10:
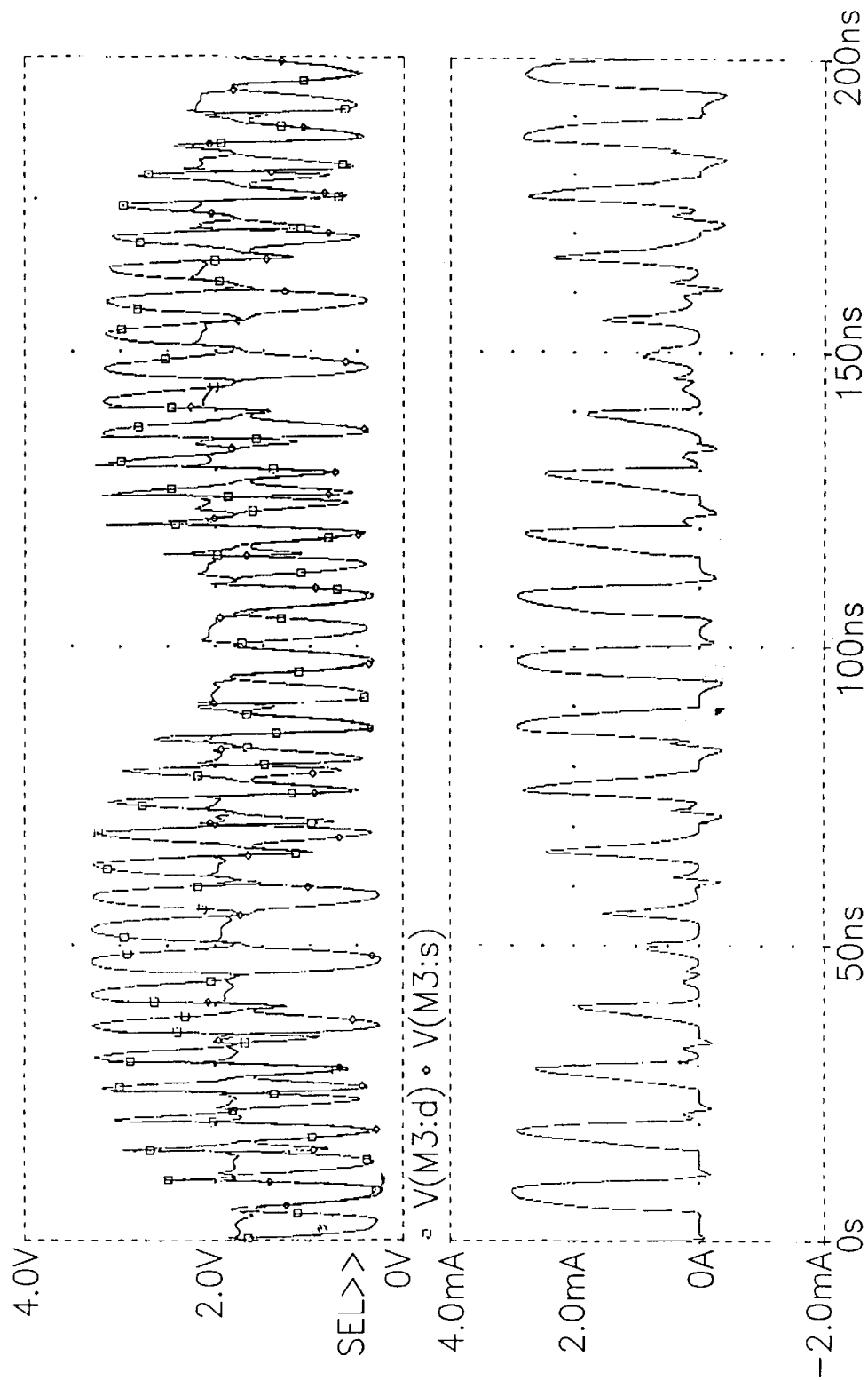
FIG. 10 shows waveforms of voltage and current of a transistor used as a switch in the mixer circuit.

In FIG. 2, the switch transistors (that is, NMOS M1 22 to NMOS M4 28) has a bias $V_{sd}=V_{gs}-V_t$. If the output voltage of the mixer circuit 20 has a large amplitude, the switch transistors are reversely conducted (that is, the polarities of the drain and source are interchanged). This phenomenon is shown as the waveforms of the voltage and current of the switch transistors of the mixer circuit in FIG. 10. In FIG. 10, the larger output voltage of the mixer circuit 20 results in the current flowing through the NMOS M1 22 smaller than zero. The current leaked from the NMOS M1 22 causes the output power of the mixer circuit 22 dropped to reduce the conversion gain and to deteriorate the linearity.

Figure 11:
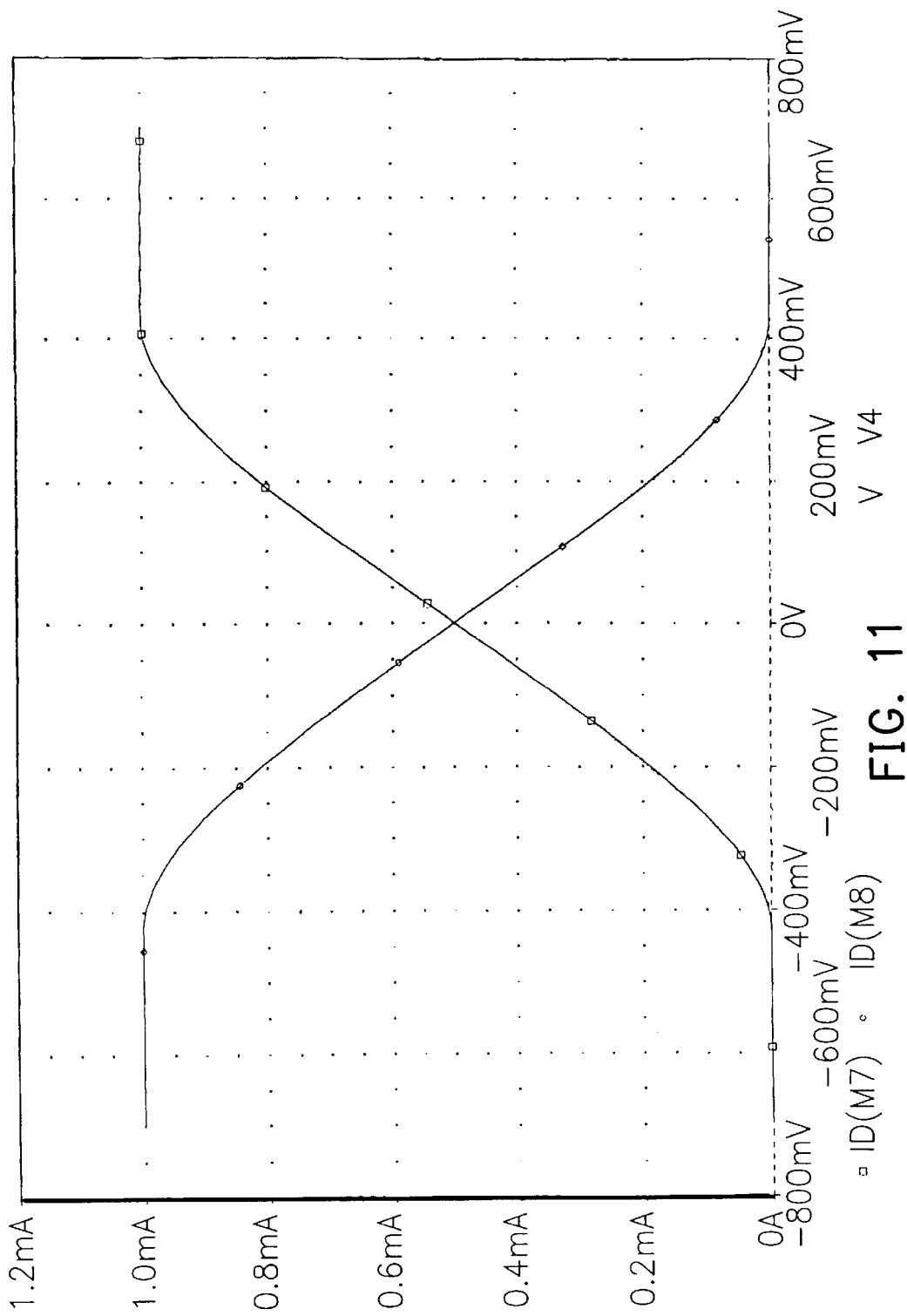
FIG. 11 shows the relationship between an output current and an input voltage of the differential pair transistors.

Another reason for the deterioration of linearity is the saturation current flowing through the differential pair transistors NMOS M5 30 and NMOS M6 32 of the mixer circuit 20 as shown as the relationship between the output current and input voltage of the differential pair transistors in FIG. 11. When the input voltage of the differential pair transistors NMOS M5 30 and NMOS M6 32 of the mixer circuit 20 is higher than 400 mV, the direct bias current flows through only one of the transistors to cause the output current of the mixer circuit 20 saturated.

Figure 12:
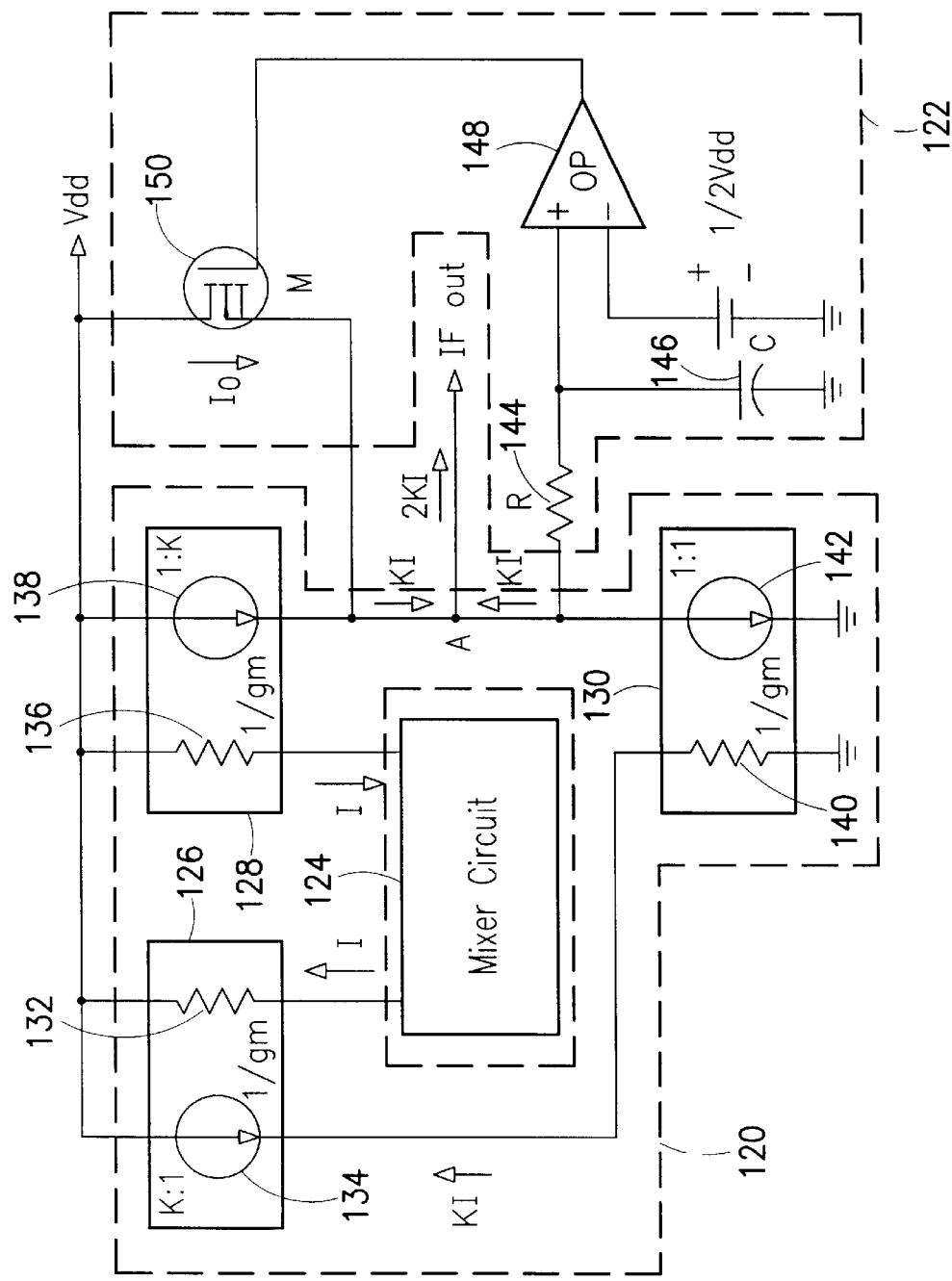
FIG. 12 shows a circuit diagram of the gain amplified circuit and the voltage auto-tracking circuit of the mixer provided in the invention.

FIG. 12 shows a circuit diagram of the gain amplified circuit and the voltage auto-tracking circuit in the mixer. The gain amplified circuit 120 comprises one current mirror circuit 126, a second current mirror circuit 128 and a third current mirror circuit 130. The impedance 1/gm 132 of the first current mirror circuit 126 has a first terminal coupled to the power source Vdd and the other terminal coupled to the power input terminal of the mixer circuit 124. The first current mirror circuit 126 further comprises a current source 134 with one terminal coupled to the power source Vdd. The first current mirror circuit 126 provides a direct current to the mixer circuit 124.

The impedance 1/gm 136 of the second current mirror circuit 128 has one terminal coupled to the power source Vdd and the other terminal coupled to another power input terminal of the mixer circuit 124. The second current mirror circuit 128 further comprises a current source 138 with one terminal coupled to the power source Vdd and the other terminal coupled to an output terminal of the gain amplified circuit 120. The second current mirror circuit 128 provides a direct current to the mixer circuit 124.

The impedance 1/gm 140 of the third current mirror circuit 130 has one terminal coupled to the other terminal of the current source 134 of the first current mirror circuit 126 and the other terminal coupled to ground. The current source 142 of the third current mirror circuit 130 has one terminal coupled to the output terminal of the gain amplified circuit 120 and the other terminal coupled to ground. The third current mirror circuit generates a direct current source.

As mentioned above, too large voltage amplitude of the mixer circuit 124 causes the deterioration of linearity. Therefore, the current mirror type with low impedance gain amplified circuit 120 improves the situation. In FIG. 12, in the gain amplified circuit 120, apart from the high input impedance point A, the rests are all low input impedance points. The low input impedance reduces the RC time constant of the mixer (referring to FIG. 1) and raises the frequency response to allow an operation with a higher output frequency.

In FIG. 12, the voltage auto-tracking circuit 122 comprises a resistor R 144, a capacitor C 146, an operation amplifier 148 and an NMOS 150. The resistor R 144 has one terminal coupled to the output terminal of the gain amplified circuit 120, that is, point A. The capacitor C 146 has one terminal coupled to the other terminal of the resistor R 144, and the other terminal coupled to ground. The operation amplifier 148 has a positive terminal coupled to the other terminal of the resistor R 144 and a negative terminal coupled to a reference voltage ½ Vdd. The operation amplifier 148 controls the direct current voltage at the output terminal of the gain amplified circuit 120 at ½ Vdd. The NMOS M 150 has a drain coupled to the power source Vdd, a source coupled to the output terminal of the gain amplified circuit 120, a gate coupled to the output terminal of the operation amplifier 148, and a base coupled to its own source.

In FIG. 12, the NMOS M 150 provides a direct current to the output terminal of the gain amplified circuit (that is, point A) to change the output voltage of the gain amplified circuit 120. The NMOS M 150 is controlled by the operation amplifier 148. Being fed back, the voltage at the output terminal of the gain amplified circuit 120 is controlled at ½ Vdd. To control the output voltage of the gain amplified circuit 120 at ½ Vdd provides a maximum amplitude without distortion, so that the linearity is enhanced. Moreover, the output of the gain amplified circuit 120 is a single terminal signal current 2KI. The load resistor (not shown) determines the magnitude of the output power of the mixer. Therefore, the conversion gain can be adjusted according to the variation of the load resistor.

Thus, the invention provides a mixer of a communication system using direct current voltage generating circuit to reduce the output power of the local oscillator, extend the battery lifetime of a mobile communication system and reduce the harmonic wave distortion to reduce the noise figure of the mixer. Using the voltage auto-tracking circuit and the gain amplified circuit, the linearity of the mixer is enhanced. In addition, by adjusting the load resistor, the conversion gain can be improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A mixer of a communication system, the communicating system comprising an antenna, a low noise amplifier, the mixer, a local oscillator and an intermediate frequency filter, the mixer comprising:

a mixer circuit, to perform a multiplication on a radio frequency received from the antenna and a radio frequency signal generated by the local oscillator;

a gain amplified circuit, coupled to a power supply terminal of the mixer circuit to increase a linearity of the mixer circuit;

a voltage auto-tracking circuit, coupled to an output terminal of the gain amplified circuit to control a direct current output from an output terminal of the gain amplified circuit; and a direct current voltage generating circuit, coupled to an input terminal of a local oscillator of the mixer circuit to generate a fixed threshold voltage.

2. The mixer according to claim 1, wherein the voltage auto-tracking circuit further comprises:

a resistor, with one terminal coupled to the output terminal of the gain amplified circuit;

a capacitor, with one terminal coupled to the other terminal of the resistor and the other terminal coupled to ground;

an operation amplifier, with a positive terminal coupled to the other terminal of the resistor, a negative terminal coupled to a reference voltage to control the direct current output from the output terminal of the gain amplified circuit; and an NMOS, with a drain coupled to a power source, a source coupled to the output terminal of the gain amplified circuit, a gate coupled to the output terminal of the operation amplifier, and a base coupled to the source of the NMOS that provides a direct current.

3. The mixer according to claim 1, wherein the gain amplified circuit further comprises:

a first current mirror circuit, further comprising:
an impedance with one terminal coupled to the power source and the other terminal coupled to a first power input terminal of the mixer circuit; and
a current source with one terminal coupled to the power source to generate a direct current to the mixer circuit;

a second current mirror circuit, further comprising:
an impedance with one terminal coupled to the power source and the other terminal coupled to a second power input terminal of the mixer circuit; and
a current source with one terminal coupled to the power source and the other terminal coupled to output terminal of the gain amplified circuit to generate a direct current to the mixer circuit; and a third current mirror circuit, further comprising:
an impedance, with one terminal coupled to the other terminal of the current source of the first current mirror circuit and the other terminal coupled to ground; and
a current source with one terminal coupled to the output terminal of the gain amplified circuit and the other terminal coupled to ground, the third current mirror circuit generating a direct current.

4. The mixer according to claim 1, wherein the direct current voltage generating circuit further comprises:

a first PMOS, having a source coupled to the power source, and a base and a drain coupled to each other;

a first NMOS, having a drain coupled to the drain of the first PMOS, a gate and coupled to the drain of the first NMOS, and a base and a source coupled to each other;

a second NMOS, having a drain coupled to the source of the first NMOS, a gate coupled to the drain of the second NMOS, and a base and a source coupled to each other;

a second PMOS, having a source coupled to the power source, a gate coupled to the gate of the first PMOS, a drain coupled to the gate of the second PMOS, and a base coupled to the drain of the second PMOS;

a third NMOS, having a drain coupled to the drain of the second PMOS, a gate coupled to the gate of the first NMOS, a base and a source coupled to each other;

a fourth NMOS, having a drain coupled to the source of the third NMOS, a gate coupled to the gate of the second PMOS, a source coupled to the source of the second NMOS, and a base coupled to the source to the fourth NMOS;

a fifth NMOS, having a drain coupled to the source of the fourth NMOS, a gate coupled to a bias power source, a source couple to ground and a base coupled to the source of the fifth NMOS;

a third PMOS, having a source coupled to the power source, a gate coupled to the drain of the second PMOS, a drain coupled to the output terminal of the direct current voltage generating circuit, and a base coupled to the drain of the third PMOS; and a sixth NMOS, having a drain coupled to the drain of the third NMOS, a gate coupled to the drain of the sixth NMOS, a source coupled to the source of the third NMOS and a base coupled to the source of the sixth NMOS.

* * * * *